US 6,573,758 B2

(12) United States Patent
Boerstler et al.

(10) Patent No.: US 6,573,758 B2
(45) Date of Patent: Jun. 3, 2003

(54) FAST, SYMMETRICAL XOR/XNOR GATE

(75) Inventors: David William Boerstler, Round Rock, TX (US); Juan Antonio Carballo, Austin, TX (US); Robert Kevin Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/965,006

(22) Filed: Sep. 27, 2001

(65) Prior Publication Data
US 2003/0058001 A1 Mar. 27, 2003

(51) Int. Cl.[7] .................. H03K 19/094; H03K 19/21
(52) U.S. Cl. .......................... 326/113; 326/54
(58) Field of Search .................. 326/113, 114, 326/112, 119, 121, 52, 54, 55

(56) References Cited

U.S. PATENT DOCUMENTS

| 5,334,888 A | | 8/1994 | Bodas | 326/54 |
|---|---|---|---|---|
| 5,523,707 A | | 6/1996 | Levy et al. | 326/52 |
| 5,648,925 A | * | 7/1997 | Curtet et al. | 327/408 |
| 5,736,868 A | | 4/1998 | Kim et al. | 326/55 |
| 5,861,762 A | * | 1/1999 | Sutherland | 326/113 |
| 5,955,912 A | * | 9/1999 | Ko | 326/113 |
| 6,373,291 B1 | * | 4/2002 | Hamada et al. | 118/313 |

FOREIGN PATENT DOCUMENTS

JP 04111611 A * 4/1992 .......... H03K/19/08

OTHER PUBLICATIONS

Rababy, Jan M. *Digital Integrated Ciruits: A Design Perspective*. Prentice Hall Electronics and Visual Series. Charles G. Sodini, Ed. pp. 212–213, undated.

* cited by examiner

Primary Examiner—Michael Tokar
Assistant Examiner—James H. Cho
(74) Attorney, Agent, or Firm—Anthony V. S. England; Casimer K. Salys

(57) ABSTRACT

In one aspect, circuitry for a digital logic function includes a first pair of input nodes for receiving respective first and second input signals, a second pair of input nodes for receiving respective complements of the first and second input signals, and an output node. The circuitry has a plurality of PFET-NFET pass gates. Such a pass gate has a first conducting electrode of the pass gate PFET connected to a first conducting electrode of the pass gate NFET, providing a first conducting node of the pass gate, and a second conducting electrode of the pass gate PFET connected to a second conducting electrode of the pass gate NFET, providing a second conducting node of the pass gate. The input nodes are connected to first conducting nodes of respective ones of the plurality of pass gates, and the second conducting nodes of the plurality of pass gates are connected to the circuitry output node.

19 Claims, 4 Drawing Sheets

| INPUT, X | INPUT, X_B | INPUT, Y | INPUT Y_B | TRANSISTORS | OUT, O |
|---|---|---|---|---|---|
| RISES | FALLS | 0 | 1 | P2, P4 | RISES |
| FALLS | RISES | 0 | 1 | N2, N3 | FALLS |
| RISES | FALLS | 1 | 0 | N1, N4 | FALLS |
| FALLS | RISES | 1 | 0 | P1, P3 | RISES |
| 0 | 1 | RISES | FALLS | P1, P3 | RISES |
| 0 | 1 | FALLS | RISES | N2, N3 | FALLS |
| 1 | 0 | RISES | FALLS | N1, N4 | FALLS |
| 1 | 0 | FALLS | RISES | P2, P4 | RISES |

| INPUTS X Y | XOR OUTPUT | XNOR OUTPUT |
|---|---|---|
| 0 0 | 0 | 1 |
| 0 1 | 1 | 0 |
| 1 0 | 1 | 0 |
| 1 1 | 0 | 1 |

*FIG. 4*

| | | FIRST SET 131 | | | | SECOND SET 132 | | | | XOR |
|---|---|---|---|---|---|---|---|---|---|---|
| X | Y | P1 | N1 | P2 | N2 | P3 | N3 | P4 | N4 | O |
| 0 | 0 | 1 | 0 | 0 | 1 | 0 | 1 | 1 | 0 | 0 |
| 0 | 1 | 1 | 0 | 0 | 1 | 1 | 0 | 0 | 1 | 1 |
| 1 | 0 | 0 | 1 | 1 | 0 | 0 | 1 | 1 | 0 | 1 |
| 1 | 1 | 0 | 1 | 1 | 0 | 1 | 0 | 0 | 1 | 0 |

*FIG. 5*

FAST, SYMMETRICAL XOR/XNOR GATE

BACKGROUND

1. Field of the Invention

This invention relates to circuitry for digital logic functions, and more particularly to pass gate circuitry for fast exclusive OR and exclusive NOR logic functions.

2. Related Art

Static CMOS digital logic circuitry is very popular because it has low power consumption and it is relatively easy to design however, it typically requires a relatively large number of transistors and the path through static CMOS logic circuitry typically includes numerous transistors in series for even a simple logic function. Pass gate logic circuitry in CMOS circuitry typically requires fewer transistors, resulting in smaller, faster circuits. However, in order to avoid signal degradation, these pass gate logic circuits typically have to be enlarged because each pass gate requires two transistors instead of one, or else output buffers are needed.

Another problem with pass gate logic CMOS circuitry concerns exclusive OR ("XOR") and exclusive NOR ("XNOR") logic circuitry. (An XOR logic circuit has two or more inputs and a corresponding output which is high if one and only one input is high, and otherwise is low. An XNOR logic circuit has two or more inputs and a corresponding output which is low if one and only one input is high, and otherwise is high.) A problem with XOR and XNOR prior pass gate logic circuitry has been a lack of symmetry in structure, resulting in asymmetrical signal transitions.

U.S. Pat. No. 5,334,880, "Fast Exclusive OR and Exclusive NOR Gates," Bodas, uses pass gates for all logic except for the case where both inputs are de asserted. This results in very non-symmetric signal transitions. Also, it has the typical pass gate disadvantage that input signals are transmitted through pass gates to the output and thereby attenuated. Finally, this gate requires four transistors for the logic function plus three more keeper transistors to deal with the signal degradation.

U.S. Pat. No. 5,523,707, "Fast, Low Power Exclusive OR Circuits," Levy at al., is pass gates, two keeper transistors and buffering output inverters. Low logic values and high logic values have transmission means of disparate quality. Low voltages get high-quality transmission since the logic devices are NFET's. High voltages need help from the PFET keeper devices to become full voltages. For some input signal changes, the signal gets transmitted from a transistor's gate to its drain, but for others it gets transmitted from drain to source, which is a higher resistance path. For example, when the first input rises to a high voltage while the second input is already high, a high-quality "0" is transmitted through a transistor channel. But when the second input rises to a high value while the first input is low, a high-quality "1" is transmitted from a transistors gate to drain. Thus, signal transitions for this logic circuitry are asymmetrical.

U.S. Pat. No. 5,736,868, "Exclusive Or/Nor Gate Circuit," Kim et al., uses pass gates and a NOR gate at the inputs. This logic circuitry also operates asymmetrically. First, inputs are connected to the NFET transistors and a pulldown stack, among other places. Thus, one input is asymmetrically connected to a higher level in the stack than the other input. Secondly, another asymmetry arises because when both inputs are low a NFET transistor connects the output to ground, but when both inputs are high, a two transistors stack connects the output to ground. Furthermore, the typical number of transistors for this logic circuitry function is no smaller than the number of transistors for the present invention.

U.S. Pat. No. 5,861,762, "Inverse Toggle XNOR and XOR Circuit," Sutherland, uses four pass gates, but is only efficient for certain applications where there exists a known order of changing input signals. Also, it too produces asymmetrical signal transitions.

Thus a need exists for improved XOR and XNOR logic circuitry.

SUMMARY

The foregoing need is addressed in the present invention, according to which circuitry for a XOR or XNOR digital logic function is symmetrically configured, with one level of pass transistors for gating. It is advantageous that the circuitry of the present invention has a symmetrical structure of pass gates so that it provides very fast operation with substantially symmetrical signal transitions. Furthermore it does so using fewer transistors than conventional static CMOS circuitry and provides the same logic function at a comparable or faster speed.

In one aspect, the circuitry includes a first pair of input nodes for receiving respective first and second input signals, a second pair of input nodes for receiving respective complements of the first and second input signals, and an output node. The circuitry has a plurality of PFET-NFET pass gates. Such a pass gate has a first conducting electrode of the pass gate PFET connected to a first conducting electrode of the pass gate NFET, providing a first conducting node of the pass gate, and a second conducting electrode of the pass gate PFET connected to a second conducting electrode of the pass gate NFET, providing a second conducting node of the pass gate. The input nodes are connected to first conducting nodes of respective ones of the plurality of pass gates, and the second conducting nodes of the plurality of pass gates are connected to the circuitry output node.

The circuitry of the present invention is fast because pass gates are inherently fast and because circuitry has a path from input to output with only one transistor in the path for any combination of input signals. This single-transistor path not only contributes to the fast speed of operation for the circuitry, but also reduces attenuation of the input signals which pass through the circuitry to the output. This reduced attenuation is important, since in an embodiment the circuitry receives only input signals and no separate operating power supply. Other objects and advantages of the invention will become apparent upon reading the following detailed description and upon reference to the accompanying drawings.

BRIEF DESCRIPTION OF THE DRAWINGS

FIG. 3 indicates the transistors that substantially contribute to driving the output node to a new state responsive to each combination of input signal change, according to the embodiment of FIGS. 1 and 2.

FIG. 4 sets out a prior art truth table 400 for an XOR and an XNOR function.

FIG. 5 shows the state of each transistor of the circuitry 100 for each combination of input signals, according to the embodiment of FIGS. 1 and 2.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
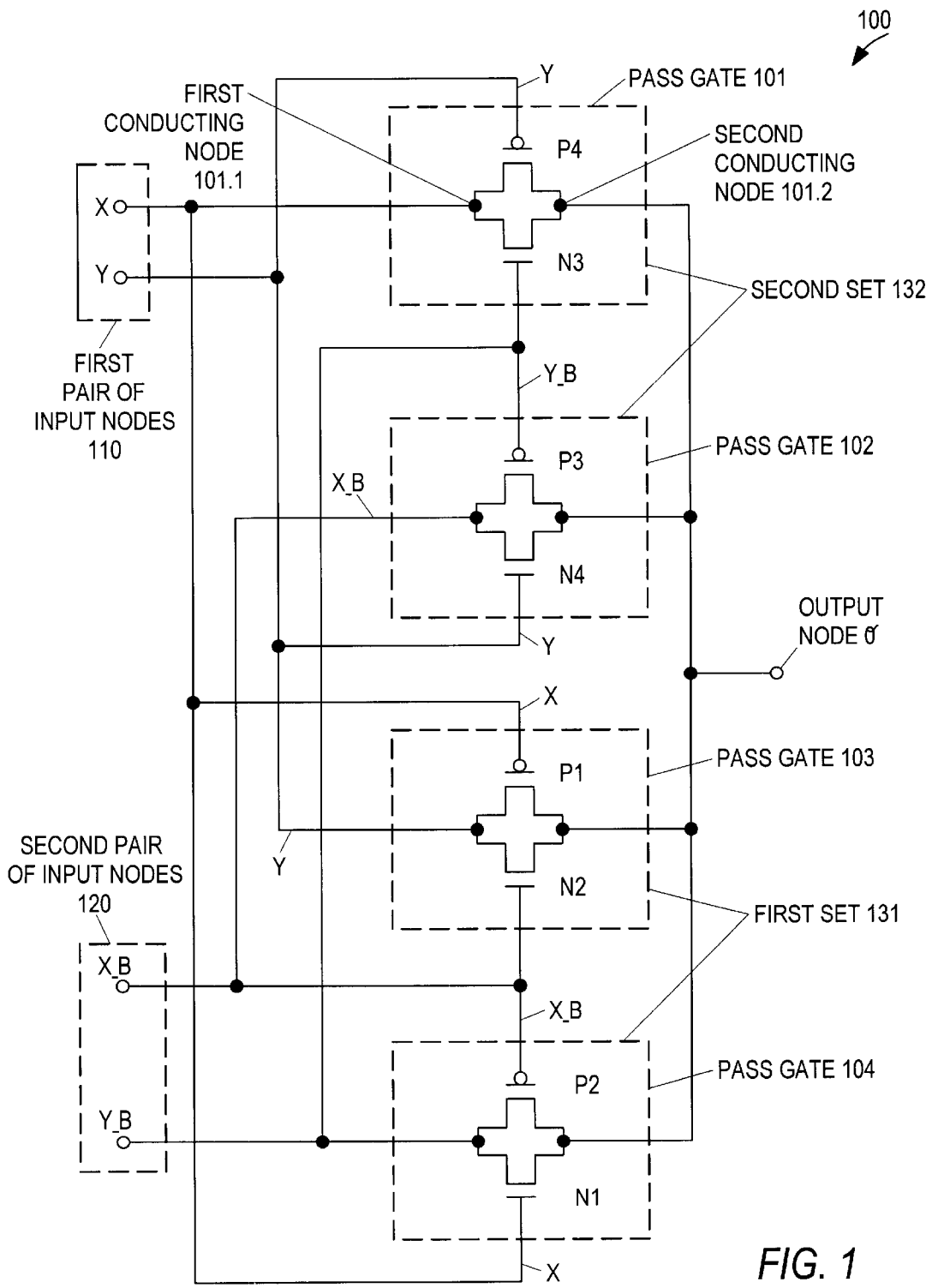
FIG. 1 shows circuitry 100 for an XOR or XNOR logic function, according to an embodiment.

Referring now to FIG. 1 circuitry 100 is shown for an XOR or XNOR logic function, according to an embodiment. (The circuitry 100 as shown in FIG. 1 performs an XOR function as set out in the truth table 400 of FIG. 4. The complements of the inputs X and Y are not explicitly shown in the truth table 400, but they are understood. The same circuitry 100 performs the XNOR function shown in the truth table 400 if the X input is switched with its complement.) The circuitry 100 has a first pair of input nodes 110 for receiving first and second input signals, X and Y, respectively, and a second pair of input nodes 120 for receiving complements of the first and second input signals, X_b and Y_b, respectively. The circuitry 100 has an output node O, and four PFET-NFET pass gates 101–104. The pass gates 101–104 are connected in a symmetrical fashion. Referring to pass gate 101, for example, a first conducting electrode of the PFET P4 is connected to a first conducting electrode of the NFET N3, providing a first conducting node 101.1. A second conducting electrode of the PFET P4 is connected to a second conducting electrode of the NFET N3, providing a second conducting node 101.2. The input node for X is connected to the first conducting node 101.1 of pass gate 101, the input node for X_b is connected to the first conducting node of pass gate 102, the input node for Y is connected to the first conducting node of pass gate 103, and the input node for Y_b is connected to the first conducting node of pass gate 104. The second conducting nodes of the pass gates are all connected to the circuitry 100 output node O.

Thus, the input node for X, for example, is associated with two transistors P4 and N3 of the pass gate 101, which has its first conducting node 101.1 connected to the input node and its second conducting node 101.2 connected to the output node. The two transistors provide first and second selectively conducting paths for the input node X interconnecting it to the circuitry 100 output node O. Each of the input nodes similarly has its own set of two selectively conducting paths to the output node O.

The input nodes for X, Y, etc. are also connected to gates of PFET's of respective ones of the plurality of pass gates and gates of NFET's of other respective ones of the plurality of pass gates. That is, for example, the input node for X is connected to the gate of P1 of the pass gate 103 and to the gate of N1 of the pass gate 104.

Note that the circuitry 100 has certain symmetrical aspects. In one aspect, the input node for the first input signal, X, and the input node for the complement of the first input signal, X_b, have connections to gates of exclusively a first set 131 of two of the pass gates, namely pass gates 103 and 104. Likewise, the input node for the second input signal, Y, and the input node for the complement of the second input signal, Y_b, have connections to gates of exclusively a second set 132 of two of the pass gates, namely pass gates 101 and 102. Furthermore, the input node for the first input signal, X, and the input node for the complement of the first input signal, X_b, have connections to conducting nodes of exclusively the second set 132 of the pass gates, while the input node for the second input signal, Y, and the input node for the complement of the second input signal, Y_b, have connections to conducting nodes of exclusively the first set 131 of two of the pass gates.

Referring now to FIG. 5, the state of each transistor of the circuitry 100 is shown for each combination of input signals, X and Y. (X_b and Y_b are understood. In the FIG., a "1" indicates that the corresponding transistor is on, and a "0" indicates that the transistor is off.) One result of the above described symmetry is that two of the four transistors P1, N1, P2 and N2 of the first set 131 is always turned on for any combination of input signals. Likewise, two of the transistors four transistors P3, N3, P4 and N4 of the second set 132 is always turned on for any combination of input signals. An implication of this structure is that the output node O is always driven to a new state by conduction among the output node and two of the input nodes through two of the turned on transistors responsive to one of the input signals changing state. This will be explained further in an example below, but first note also that one of the two turned on transistors in the first set 131 is always a PFET and one is always a NFET. Likewise, one of the two turned on transistors in the second set 132 is always a PFET and one is always a NFET.

FIG. 3 illustrates a consequence of the symmetry of the circuitry of FIG. 1. Consider the case, for example, where input signal X and input signal Y are initially both de asserted and input signal X rises, with reference to FIGS. 3 and 5 in conjunction with FIG. 1. PFET transistor P4 begins conducting because input signal Y at the gate of P4 stays low, and thus with X going high at the source of P4 this drives the gate-to-source voltage of P4 to a voltage differential that turns on P4. PFET transistor P2 begins conducting because the input signal X_b at the gate of P2 goes low, and with signal Y_b at the source of P2 staying high this drives the gate-to-source of P2 to voltage differential that turns on P2. Note that N1 and N3 also turn on in response to the rising input signal X (and falling input signal X_b). Specifically, with signal Y_b remaining high at the source of N1 and input signal X going high at the gate, this turns on N1. Likewise, with signal Y_b remaining high at the gate of N3 and input signal X going high at the source, this turns on N3. However, NFET's do not conduct as well for a rising signal transition as do PFET's, therefore, as indicated in FIG. 3, transistors P2 and P4 conduct a substantial majority of the current to drive the output node O high. Thus, as may be seen by inspection of the circuitry 100 of FIG. 1 and the table of FIG. 3, it is a consequence of the symmetry of the circuitry 100 that two PFET's selectively conduct current from associated input nodes to the output node O to drive the output node O in instances where the output node is driven higher by a changing input signal, whereas two selectively NFET's conduct current from the output node O to associated input nodes to drive the output node O in instances where the output node is driven lower.

Figure 2:
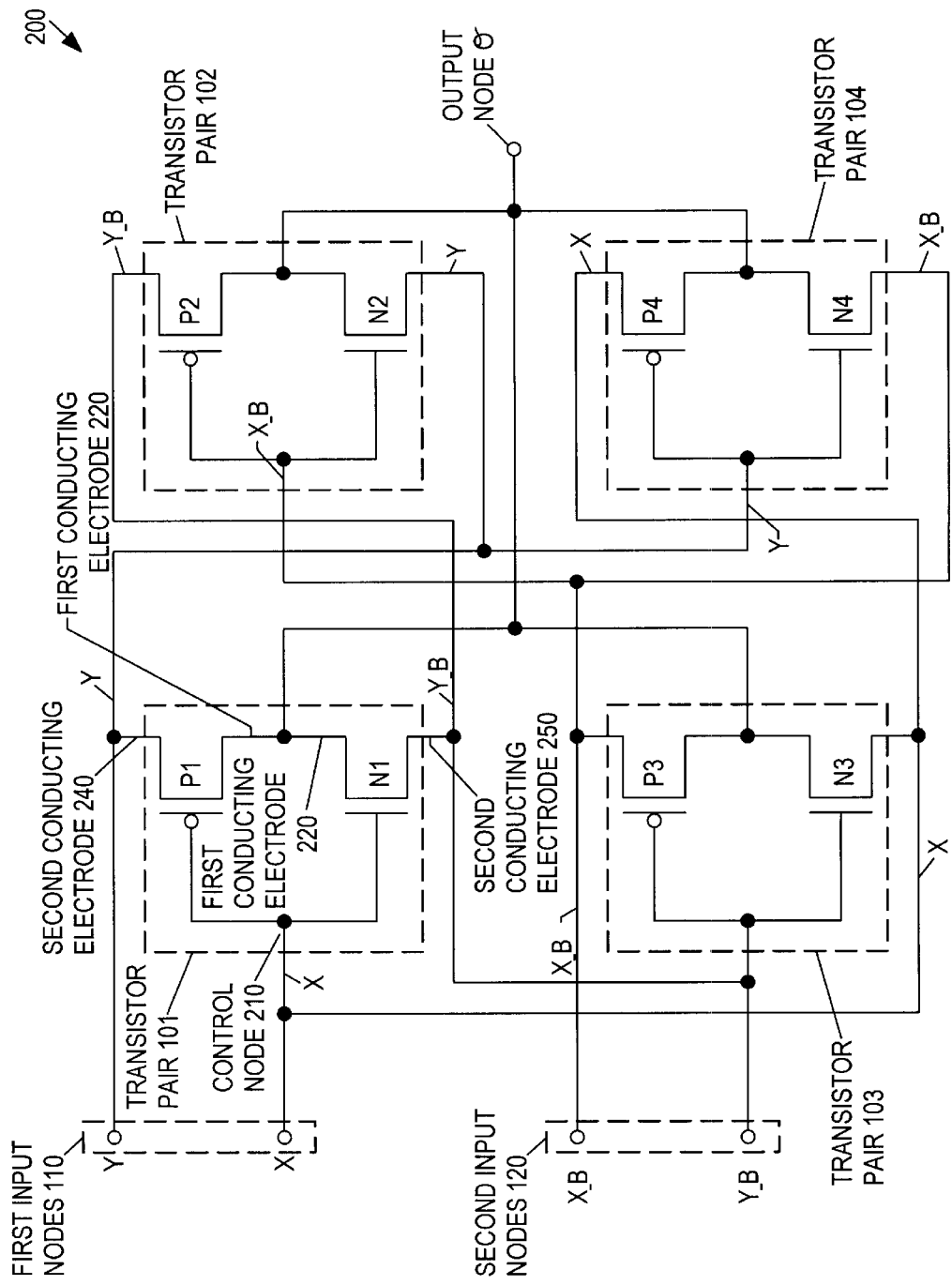
FIG. 2, shows the same circuitry 100, but it with its transistors grouped together in a different way to emphasize certain aspects of the circuitry's structure.
Figure 6:
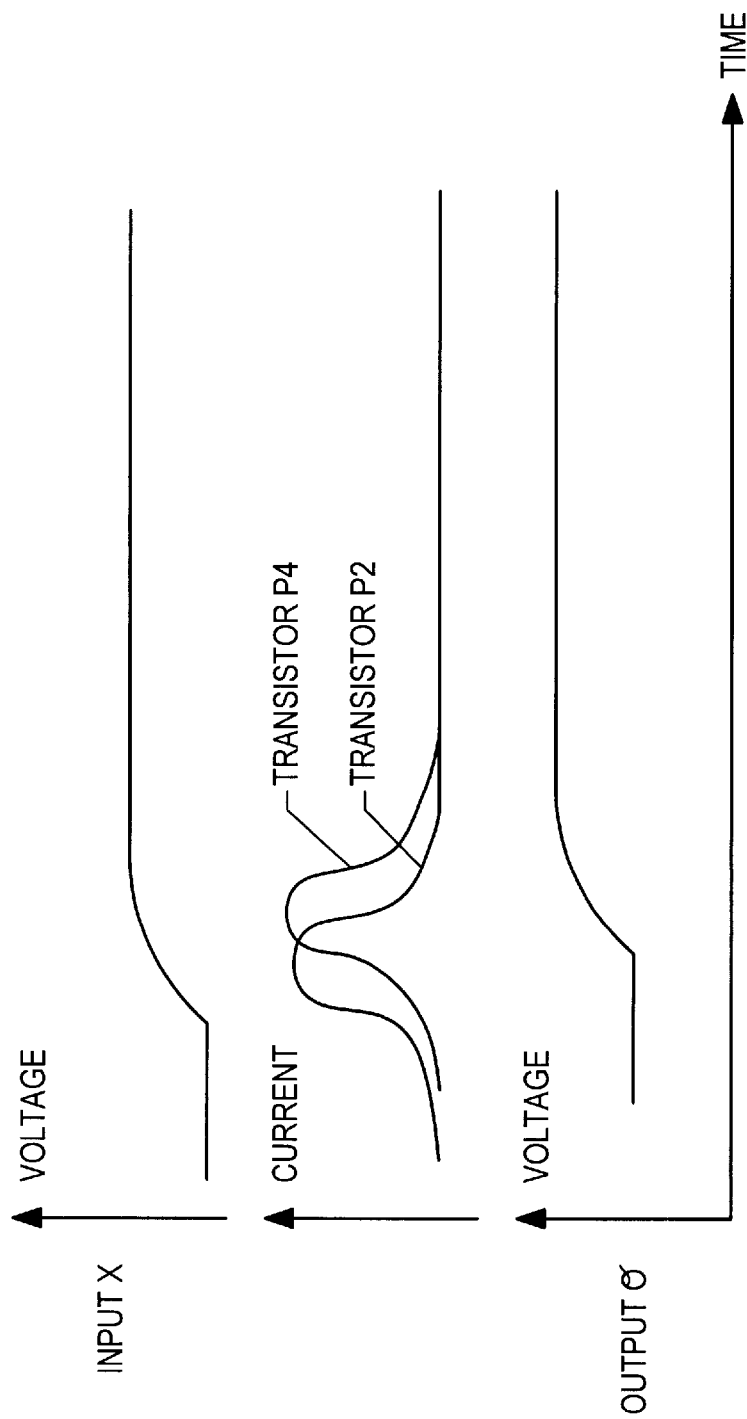
FIG. 6 shows, for the circuitry 100 of FIGS. 1 and 2, current through two of the transistors and output voltage on node O responsive to a changing input signal, X.

Referring now to FIG. 6, which shows, for the circuitry 100 of FIGS. 1 and 2, current through two of the transistors and output voltage on node O responsive to the changing input signal, X. Another consequence of the structure of the circuitry 100 is that when an input signal (that is, an input signal and it's complement signal) changes, one of the transistors has its gate connected to and is turned on by the changing input signal or its changing complement signal. This transistor will first conduct current to drive the output node O to its new state. When this transistor's current starts to diminish, one of the other transistors that is turned on in response to the changing signal or its changing complement signal and that has one of its conducting electrodes connected to the signal will begin to peak, thereby conducting additional current for driving the output node O to the new state. Specifically, in terms of the previous example, when input signal X rises and it's complement signal X_b falls, transistor P2 has its gate connected to and is turned on by the changing input complement signal X_b. Thus, P2 will first conduct current to drive the output node O to its new high state. Transistor P4 is also turned on in response to the changing signal X and has one of its conducting electrodes connected to X. When P2's current starts to diminish, the current from X through P4 to the output node O will begin to peak, thereby adding to the current and thus providing a more nearly constant total current driving the output node O to the new state.

Referring now to FIG. 2, the same circuitry 100 is shown, but it is drawn with its transistors grouped together in a different way to emphasize certain aspects of the circuitry's structure. Specifically, in this FIG. 2 transistor P1 and transistor N1 are shown as a transistor pair 101, transistors P2 and N2 are transistor pair 102, transistors P3 and N3 are transistor pair 103, and transistors P4 and N4 are transistor pair 104. Each transistor pair has gate electrodes of the pair connected together, providing a control node for the transistor pair. For example, see control node 210 in FIG. 2. Each transistor pair also has a first conducting electrode of each PFET and NFET of the transistor pair connected to the circuitry output node O. For example, see first conducting electrode 220 for PFET P1 and first conducting electrode 230 for NFET N1. Each transistor pair also has a second PFET conducting electrode and a second NFET conducting electrode. For example, see second conducting electrode 240 for PFET P1 and second conducting electrode 250 for NFET N1.

Each one of the input nodes is connected to one of the transistor pair control nodes, one of the PFET second conducting electrodes and one of the NFET second conducting electrodes. More particularly, each one of the input nodes is connected to a respective one of the transistor pair control nodes, a respective one of the PFET second conducting electrodes and a respective one of the NFET second conducting electrodes. Specifically, input node for signal X is connected to control node 210, the input node for X_b is connected to the control node of the second one of the transistor pairs, 102, the input node for Y_b is connected to the control node of the third one of the transistor pairs, 103, and the input node for Y is connected to the control node of the fourth one of the transistor pairs, 104. The input node for X is connected to the second conducting electrode of the NFET of the third transistor pair 103 and the second conducting electrode of the PFET of the fourth transistor pair 104. The input node for Y is connected to the second conducting electrode of the PFET of the first transistor pair 101 and the second conducting electrode of the NFET of the second transistor pair 102. The input node for X_b is connected to the second conducting electrode of the NFET of the fourth transistor pair 104 and the second conducting electrode of the PFET of the third transistor pair 103. The input node for Y_b is connected to the second conducting electrode of the NFET of the first transistor pair 101 and the second conducting electrode of the PFET of the second transistor pair 102.

The description of the present embodiment has been presented for purposes of illustration, but is not intended to be exhaustive or to limit the invention to the form disclosed. Many additional aspects, modifications and variations are also contemplated. For example, XOR/XNOR logic circuitry for more than two inputs is provided by cascading the circuitry 100 (FIG. 1).

What is claimed is:

1. Circuitry for a digital logic function comprising:
   a first pair of input nodes for receiving respective first and second input signals;
   a second pair of input nodes for receiving respective complements of the first and second input signals;
   an output node; and
   a plurality of PFET-NFET pass gates, such a pass gate having a first conducting electrode of the pass gate PFET connected to a first conducting electrode of the pass gate NFET, providing a first conducting node of the pass gate, and a second conducting electrode of the pass gate PFET connected to a second conducting electrode of the pass gate NFET, providing a second conducting node of the pass gate, wherein the input nodes are connected to first conducting nodes of respective ones of the plurality of pass gates, and the second conducting nodes of the plurality of pass gates are connected to the circuitry output node, wherein the input nodes are connected to gates of PFET's of respective ones of the plurality of pass gates and gates of NFET's of other respective ones of the plurality of pass gates.

2. The circuitry of claim 1, wherein the pass gates are solely four in number.

3. Circuitry for a digital logic function comprising:
   a first pair of input nodes for receiving respective first and second input signals;
   a second pair of input nodes for receiving respective complements of the first and second input signals;
   an output node; and
   a plurality of PFET-NFET pass gates, such a pass gate having a first conducting electrode of the pass gate PFET connected to a first conducting electrode of the pass gate NFET, providing a first conducting node of the pass gate, and a second conducting electrode of the pass gate PFET connected to a second conducting electrode of the pass gate NFET, providing a second conducting node of the pass gate, wherein the input nodes are connected to the first conducting nodes of respective ones of the plurality of pass gates, and the second conducting nodes of the plurality of pass gates are connected to the circuitry output node, wherein the digital logic function is an exclusive OR or an exclusive NOR function.

4. Circuitry for a digital logic function comprising:
   a first pair of input nodes for receiving respective first and second input signals;
   a second pair of input nodes for receiving respective complements of the first and second input signals;
   an output node; and
   a plurality of PFET-NFET pass gates, such a pass gate having a first conducting electrode of the pass gate PFET connected to a first conducting electrode of the pass gate NFET, providing a first conducting node of the pass gate, and a second conducting electrode of the pass gate PFET connected to a second conducting electrode of the pass gate NFET, providing a second conducting node of the pass gate, wherein the input nodes are connected to the first conducting nodes of respective ones of the plurality of pass gates, and the second conducting nodes of the plurality of pass gates are connected to the circuitry output node, wherein for a first set of two of the pass gates the first conducting nodes are connected, respectively, to the input node for the first input signal and the input node for the complement of the first input signal and for a second set of two of the pass gates the first conducting nodes are connected, respectively, to the input node for the second input signal and the input node for the complement of the second input signal, and wherein two of the transistors of the first set and two of the transistors of the second set are turned on by the first input signal, second input signal, complement of the first input signal and complement of the second input signal regardless of whether the first input signal is asserted, the second input signal is asserted, or neither of the first and second input signals is asserted.

5. Circuitry for a digital logic function comprising:
a first pair of input nodes for receiving respective first and second input signals;
a second pair of input nodes for receiving respective complements of the first and second input signals;
an output node for selectively asserting and de asserting an output signal responsive to the input signals; and
a plurality of transistors, wherein the input nodes have respective first and second selectively conducting paths interconnecting the input nodes to the circuitry output node, each conducting path having a respective one of the plurality of transistors with a first conducting electrode of the transistor connected to the conducting path's input node and second conducting electrode of the transistor connected to the circuitry output node, wherein each input node is connected to gates of two respective ones of the plurality of transistors.

6. The circuitry of claim 5, wherein the respective transistor of each selectively conducting path is the only transistor in the respective conducting path.

7. The circuitry of claim 5, wherein the transistor of each first path is a PFET and the transistor of each second path is a NFET.

8. Circuitry for a digital logic function comprising:
a first pair of input nodes for receiving respective first and second input signals;
a second pair of input nodes for receiving respective complements of the first and second input signals;
an output node for selectively asserting and de asserting an output signal responsive to the input signals; and
a plurality of transistors, wherein the input nodes have respective first and second selectively conducting paths interconnecting the input nodes to the circuitry output node, each conducting path having a respective one of the plurality of transistors with a first conducting electrode of the transistor connected to the conducting path's input node and second conducting electrode of the transistor connected to the circuitry output node, wherein the digital logic function is an exclusive OR or an exclusive NOR function.

9. The circuitry of claim 8, wherein the transistors are solely eight in number.

10. Circuitry for a digital logic function comprising:
a first pair of input nodes for receiving respective first and second input signals;
a second pair of input nodes for receiving respective complements of the first and second input signals;
an output node for selectively asserting and de asserting an output signal responsive to the input signals; and
a plurality of transistors, wherein the input nodes have respective first and second selectively conducting paths interconnecting the input nodes to the circuitry output node, each conducting path having a respective one of the plurality of transistors with a first conducting electrode of the transistor connected to the conducting path's input node and second conducting electrode of the transistor connected to the circuitry output node for a first set of two pairs of the transistors the first conducting nodes of each pair are connected, respectively, to the input node for the first input signal and the input node for the complement of the first input signal, and for the second set of two pairs of the transistors the first conducting nodes are connected, respectively, to the input node for the second input signal and the input node for the complement of the second input signal, wherein two of the transistors of the first set and two of the transistors of the second set are turned on by the first input signal, second input signal, complement of the first input signal and complement of the second input signal regardless of whether the first input signal is asserted, the second input signal is asserted, or neither of the first and second input signals is asserted.

11. Circuitry for a digital logic function comprising:
a first pair of input nodes for receiving respective first and second input signals;
a second pair of input nodes for receiving respective complements of the first and second input signals;
an output node; and
a number of PFET-NFET transistor pairs, each transistor pair having gate electrodes of the pair connected together, providing a control node for the transistor pair, the transistor pair also having a first conducting electrode of each PFET and NFET of the transistor pair connected to the circuitry output node and having a second PFET conducting electrode and a second NFET conducting electrode, wherein each one of the input nodes is connected to one of the transistor pair control nodes, one of the PFET second conducting electrodes and one of the NFET second conducting electrodes.

12. The circuitry of claim 11, wherein the input node for the first input signal is connected to the control node of a first one of the transistor pairs, the input node for the complement of the first input signal is connected to the control node of a second one of the transistor pairs, the input node for the complement of the second input is connected to the control node of a third one of the transistor pairs, and the input node for the second input signal is connected to the control node of a fourth one of the transistor pairs.

13. The circuitry of claim 12, wherein the input node for the first input signal is connected to the second conducting electrode of the NFET of the third transistor pair and the second conducting electrode of the PFET of the fourth transistor pair, the input node for the second input signal is connected to the second conducting electrode of the PFET of the first transistor pair and the second conducting electrode of the NFET of the second transistor pair, the input node for the complement of the first input signal is connected to the second conducting electrode of the NFET of the fourth transistor pair and the second conducting electrode of the PFET of the third transistor pair, and the input node for the complement of the second input is connected to the second conducting electrode of the NFET of the first transistor pair and the second conducting electrode of the PFET of the second transistor pair.

14. The circuitry of claim 11, wherein the digital logic function is an exclusive OR or an exclusive NOR function.

15. The circuitry of claim 11, wherein the transistor pairs are solely four in number.

16. A method in a digital XOR or XNOR logic gate having a first pair of input nodes for receiving respective first and second input signals, a second pair of input nodes for receiving respective complements of the first and second input signals and an output node for selectively asserting and de asserting an output signal responsive to the input signals, the method comprising the steps of:

a) turning on solely four transistors responsive to any combination of the input signals on the input nodes;

b) driving the output node to a new state by conduction among the output node and two of the input nodes through two of the turned on transistors responsive to one of the input signals changing state, wherein a combination of the input node for the first input signal and the input node for the complement of the first input signal are connected respectively to conducting electrodes of a first set of four of the transistors, and a combination of the input node for the second input signal and the input node for the complement of the second input signal are connected respectively to conducting electrodes of a second set of four of the transistors, and wherein step a) comprises two transistors of the first set being turned on and two transistors of the second set being turned on, wherein one of the two turned on transistors in the first set is a PFET and one is a NFET, and one of the two turned on transistors in the second set is a PFET and one is a NFET, and wherein step b) comprises the PFET's selectively conducting current to drive the output node in instances where the output node is driven higher, and the NFET's conducting current to drive the output node in instances where the output node is driven lower.

17. The method of claim 16, wherein for any single changing input signal a first certain one of the transistors has its gate connected to and is turned on by the changing input signal or its changing complement signal and a second certain one of the other transistors is turned on in response to the changing signal or its changing complement signal and has one of its conducting electrodes connected to the signal, and wherein step b) comprises the steps of:

first conducting current more by the first certain transistor than the second certain transistor to drive the output node to the new state; and second conducting current second more by the second certain transistor than the first certain transistor for driving the output node to the new state.

18. A method in a digital XOR or XNOR logic gate having a first pair of input nodes for receiving respective first and second input signals, a second pair of input nodes for receiving respective complements of the first and second input signals and a single output node for selectively asserting and de asserting an output signal responsive to the input signals, the method comprising the steps of:

a) turning on solely four transistors responsive to the input signals on the input nodes, regardless of whether the first input-signal is asserted, the second input signal is asserted, or neither of the first and second input signals is asserted;

b) driving the output node to a new state by conduction among the output node and two of the input nodes through two of the turned on transistors responsive to one of the input signals changing state, wherein each transistor in the logic gate has a respective conducting electrode coupled to the output node.

19. The method of claim 18, wherein a combination of the input node for the first input signal and the input node for the complement of the first input signal are connected respectively to conducting electrodes of a first set of four of the transistors, and a combination of the input node for the second input signal and the input node for the complement of the second input signal are connected respectively to conducting electrodes of a second set of four of the transistors, and wherein step a) comprises two transistors of the first set being turned on and two transistors of the second set being turned on.

* * * * *